US012176859B2

United States Patent
Liu

(10) Patent No.: US 12,176,859 B2
(45) Date of Patent: Dec. 24, 2024

(54) ASYMMETRIC DOHERTY POWER AMPLIFIERS

(71) Applicant: Skyworks Solutions, Inc., Irvine, CA (US)

(72) Inventor: Mingming Liu, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 340 days.

(21) Appl. No.: 17/814,627

(22) Filed: Jul. 25, 2022

(65) Prior Publication Data

US 2023/0072490 A1    Mar. 9, 2023

Related U.S. Application Data

(60) Provisional application No. 63/241,333, filed on Sep. 7, 2021.

(51) Int. Cl.
| | | |
|---|---|---|
| *H03F 1/02* | (2006.01) | |
| *H03F 1/56* | (2006.01) | |
| *H03F 3/24* | (2006.01) | |
| *H04B 1/40* | (2015.01) | |

(52) U.S. Cl.
CPC ........... *H03F 1/0288* (2013.01); *H03F 1/565* (2013.01); *H03F 3/245* (2013.01); *H04B 1/40* (2013.01); *H03F 2200/171* (2013.01); *H03F 2200/387* (2013.01); *H03F 2200/451* (2013.01)

(58) Field of Classification Search
CPC ........ H03F 1/0288; H03F 1/565; H03F 3/245; H03F 2200/171; H03F 2200/387; H03F 2200/451; H04B 1/40
See application file for complete search history.

(56) References Cited

U.S. PATENT DOCUMENTS

| | | |
|---|---|---|
| 6,731,172 B2 | 5/2004 | Thompson |
| 6,731,173 B1 | 5/2004 | Thompson |
| 6,917,246 B2 | 7/2005 | Thompson |
| 6,970,039 B2 | 11/2005 | Griffith et al. |
| 9,071,211 B1 | 6/2015 | Ozard |
| 9,450,541 B2 | 9/2016 | Lizarraga et al. |
| 9,461,596 B1 | 10/2016 | Ozard |
| 9,467,115 B2 | 10/2016 | Lyalin |
| 9,712,119 B2 | 7/2017 | Datta et al. |

(Continued)

OTHER PUBLICATIONS

Grebennikov et al., High-Efficiency Doherty Power Amplifiers: Historical Aspect and Modern Trends, Nov. 2012, Proceedings of the IEEE, vol. 100, Issue 12 (Year: 2012).*

(Continued)

*Primary Examiner* — Said M Elnoubi
(74) *Attorney, Agent, or Firm* — Knobbe, Martens, Olson and Bear, LLP

(57) ABSTRACT

Asymmetric Doherty power amplifiers are disclosed. In certain embodiments, a Doherty power amplifier includes a carrier amplifier that generates a radio frequency carrier signal based on amplifying a radio frequency input signal, a peaking amplifier that generates a radio frequency peaking signal based on amplifying the radio frequency input signal, and a phase shifting and combining circuit configured to combine the radio frequency carrier signal and the radio frequency peaking signal to generate a radio frequency output signal. The carrier amplifier and the peaking amplifier have asymmetric amplifier sizes.

17 Claims, 9 Drawing Sheets

(56) References Cited

U.S. PATENT DOCUMENTS

| | | |
|---|---|---|
| 9,774,300 B2 | 9/2017 | Jin et al. |
| 9,800,207 B2 | 10/2017 | Datta et al. |
| 9,806,681 B2 | 10/2017 | Lehtola |
| 9,853,610 B2 | 12/2017 | Lizarraga et al. |
| 9,899,961 B2 | 2/2018 | Lehtola et al. |
| 9,912,298 B2 | 3/2018 | Lyalin et al. |
| 9,912,299 B2 | 3/2018 | Lyalin |
| 9,923,523 B2 | 3/2018 | Lehtola |
| 9,935,594 B2 | 4/2018 | Lehtola |
| 10,243,517 B2 | 3/2019 | Lehtola et al. |
| 10,291,185 B2 | 5/2019 | Lyalin et al. |
| 10,355,647 B2 | 7/2019 | Datta et al. |
| 10,483,918 B2 | 11/2019 | Jin et al. |
| 10,554,177 B2 | 2/2020 | Lyalin et al. |
| 10,756,677 B2 | 8/2020 | Lehtola |
| 10,778,152 B2 | 9/2020 | Lyalin et al. |
| 10,804,866 B2 | 10/2020 | Lehtola |
| 10,840,861 B1 | 11/2020 | Al-Shyoukh |
| 10,972,055 B2 | 4/2021 | Naraine et al. |
| 11,018,628 B2 | 5/2021 | Lehtola |
| 11,070,174 B2 | 7/2021 | Lyalin et al. |
| 11,101,775 B2 | 8/2021 | Datta et al. |
| 11,165,393 B2 | 11/2021 | Pehlke |
| 11,233,482 B2 | 1/2022 | Al-Shyoukh |
| 11,398,798 B2 | 7/2022 | Korba et al. |
| 2020/0091870 A1 | 3/2020 | Lehtola et al. |
| 2021/0203280 A1 | 7/2021 | Naraine et al. |
| 2021/0320626 A1 | 10/2021 | Lyalin et al. |
| 2021/0384868 A1 | 12/2021 | Datta et al. |
| 2022/0014153 A1 | 1/2022 | Pehlke |
| 2022/0255508 A1 | 8/2022 | Lehtola et al. |

OTHER PUBLICATIONS

Yang et al., A Fully Matched N-Way Doherty Amplifier With Optimized Linearity, Mar. 2003, IEEE Transactions on Microwave Theory Andtechniques, vol. 51, No. 3, (Year: 2003).*

* cited by examiner

ASYMMETRIC DOHERTY POWER AMPLIFIERS

CROSS-REFERENCE TO RELATED APPLICATIONS

This application claims the benefit of priority under 35 U.S.C. § 119 of U.S. Provisional Patent Application No. 63/241,333, filed Sep. 7, 2021 and titled "ASYMMETRIC DOHERTY POWER AMPLIFIERS," which is herein incorporated by reference in its entirety.

BACKGROUND

Technical Field

Embodiments of the invention relate to electronic systems, and in particular, to radio frequency (RF) electronics.

Description of Related Technology

Power amplifiers are used in RF communication systems to amplify RF signals for transmission via antennas.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

SUMMARY

In certain embodiments, the present disclosure relates to a mobile device that includes a transceiver configured to generate a radio frequency input signal, and a front end system including a Doherty power amplifier. The Doherty power amplifier includes a carrier amplifier configured to generate a radio frequency carrier signal based on amplifying the radio frequency input signal, a peaking amplifier configured to generate a radio frequency peaking signal based on amplifying the radio frequency input signal, and a phase shifting and combining circuit configured to combine the radio frequency carrier signal and the radio frequency peaking signal to generate a radio frequency output signal. The carrier amplifier and the peaking amplifier having asymmetric amplifier sizes.

In various embodiments, the peaking amplifier has an output transistor array size that is smaller than an output transistor array size of the carrier amplifier. According to a number of embodiments, the output transistor array size of the peaking amplifier is at least ten percent smaller than the output transistor array size of the carrier amplifier.

In some embodiments, the carrier amplifier includes a first differential output configured to provide the radio frequency carrier signal, and the peaking amplifier includes a second differential output configured to provide the radio frequency peaking signal. According to a number of embodiments, the phase shifting and combining circuit includes an output balun having a primary winding connected to the second differential output, and a plurality of passive components connected between the first differential output and the primary winding and operable to provide a phase shift to the radio frequency carrier signal. In accordance with several embodiments, the mobile device further includes an output matching circuit and an output filter connected in series between a secondary winding of the output balun and an output terminal that provides the radio frequency output signal. According to various embodiments, the carrier amplifier includes a first pair of bipolar transistors and the peaking amplifier includes a second pair of bipolar transistors of smaller size than the first pair of bipolar transistors, the first differential output being across a first pair of collectors of the first pair of bipolar transistors, and the second differential output being across a second pair of collectors of the second pair of bipolar transistors.

In several embodiments, the mobile device further includes a splitting and phase shifting circuit configured to receive the radio frequency input signal and to provide a first radio frequency signal to an input of the carrier amplifier and a second radio frequency signal to an input of the peaking amplifier, the first radio frequency signal and the second radio frequency signal having a phase shift of about ninety degrees.

In some embodiments, the mobile device further includes an antenna configured to transmit the radio frequency output signal.

In certain embodiments, the present disclosure relates to a Doherty power amplifier. The Doherty power amplifier includes a carrier amplifier configured to generate a radio frequency carrier signal based on amplifying a radio frequency input signal, a peaking amplifier configured to generate a radio frequency peaking signal based on amplifying the radio frequency input signal, and a phase shifting and combining circuit configured to combine the radio frequency carrier signal and the radio frequency peaking signal to generate a radio frequency output signal. The carrier amplifier and the peaking amplifier have asymmetric amplifier sizes.

In some embodiments, the peaking amplifier has an output transistor array size that is smaller than an output transistor array size of the carrier amplifier. According to a number of embodiments, the output transistor array size of the peaking amplifier is at least ten percent smaller than the output transistor array size of the carrier amplifier.

In several embodiments, the carrier amplifier includes a first differential output configured to provide the radio frequency carrier signal, and the peaking amplifier includes a second differential output configured to provide the radio frequency peaking signal. According to a number of embodiments, the phase shifting and combining circuit includes an output balun having a primary winding connected to the second differential output, and a plurality of passive components connected between the first differential output and the primary winding and operable to provide a phase shift to the radio frequency carrier signal. In accordance with various embodiments, the Doherty power amplifier further includes an output matching circuit and an output filter connected in series between a secondary winding of the output balun and an output terminal that provides the radio frequency output signal. According to some embodiments, the carrier amplifier includes a first pair of bipolar transistors and the peaking amplifier includes a second pair of bipolar transistors of smaller size than the first pair of bipolar transistors, the first differential output being across a first pair of collectors of the first pair of bipolar transistors, and the second differential output being across a second pair of collectors of the second pair of bipolar transistors.

In various embodiments, the Doherty power amplifier further includes a splitting and phase shifting circuit configured to receive the radio frequency input signal and to provide a first radio frequency signal to an input of the carrier amplifier and a second radio frequency signal to an input of the peaking amplifier, the first radio frequency signal and the second radio frequency signal having a phase shift of about ninety degrees.

In certain embodiments, the present disclosure relates to a method of radio frequency signal amplification in a mobile device. The method includes generating a radio frequency carrier signal based on amplifying the radio frequency input signal using a carrier amplifier, generating a radio frequency peaking signal based on amplifying the radio frequency input signal using a peaking amplifier, combining the radio frequency carrier signal and the radio frequency peaking signal to generate a radio frequency output signal using a phase shifting and combining circuit, the carrier amplifier and the peaking amplifier having asymmetric amplifier sizes.

In several embodiments, the peaking amplifier has an output transistor array size that is smaller than an output transistor array size of the carrier amplifier. According to various embodiments, the output transistor array size of the peaking amplifier is at least ten percent smaller than the output transistor array size of the carrier amplifier.

In some embodiments, the method further includes transmitting the radio frequency output signal using an antenna.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
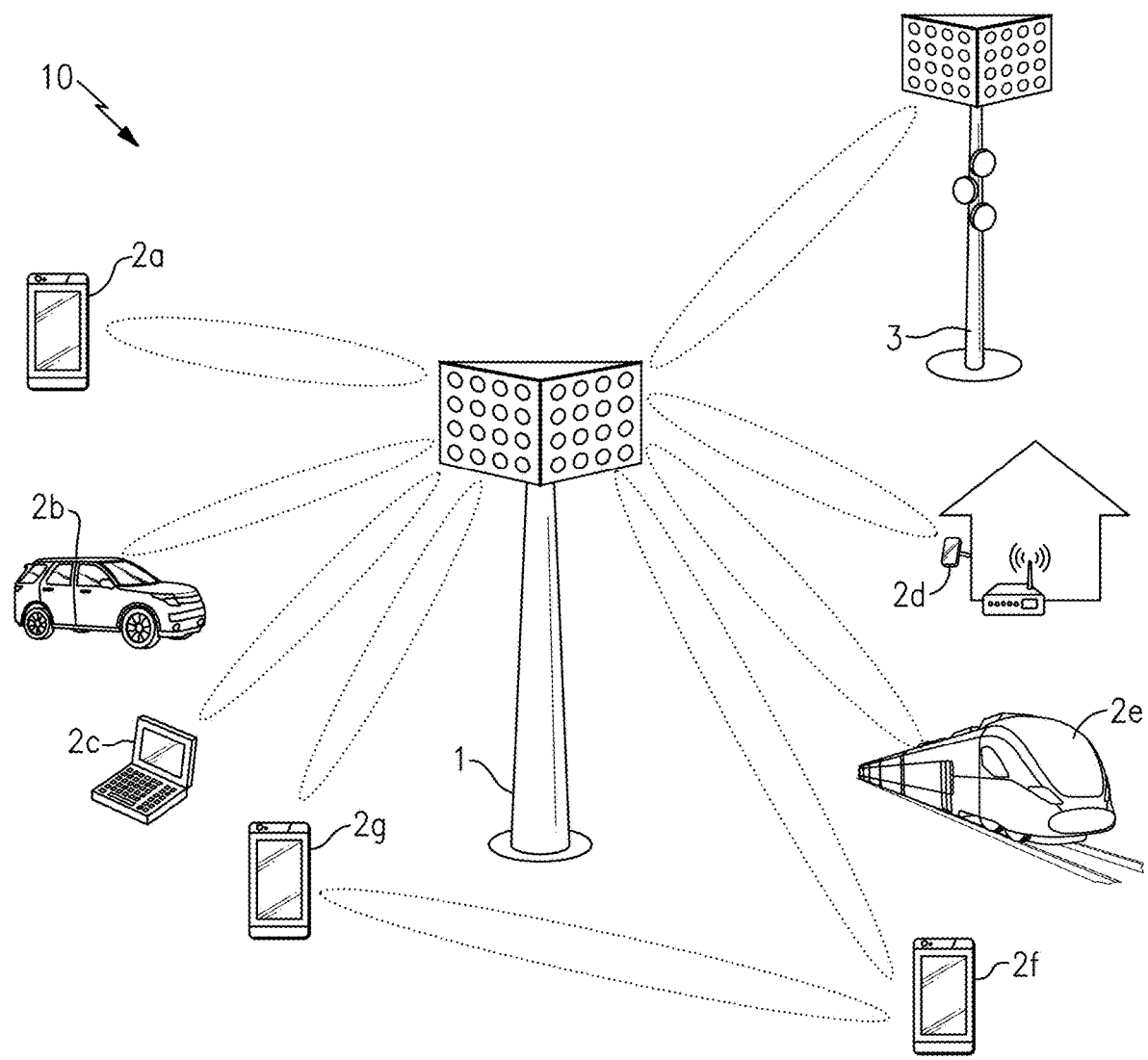
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1) in the range of about 410 MHz to about 7.125 GHz, Frequency Range 2 (FR2) in the range of about 24.250 GHz to about 52.600 GHz, or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Asymmetric Doherty Power Amplifiers

The linearity of a power amplifier is directly related to a level of gain compression within the power amplifier. Thus, a power amplifier can be designed for a fixed supply voltage that defines the target load impedance for acceptable linearity.

In certain applications, such as mobile handsets, operating environment leads to a relatively large variation in the load presented to a power amplifier. For example, a voltage standing wave ratio (VSWR) of an antenna and thus the power amplifier's load can vary based on a user's handling of the mobile handset. The load variation degrades power amplifier linearity and/or spectral performance.

One type of power amplifier is a Doherty power amplifier, which includes a main or carrier amplifier and an auxiliary or peaking amplifier that operate in combination with one another to amplify an RF signal. The Doherty power amplifier combines a carrier signal from the carrier amplifier and a peaking signal from the peaking amplifier to generate an amplified RF output signal. In certain implementations, the carrier amplifier is enabled over a wide range of power levels (for instance, by a class AB bias circuit) while the peaking amplifier is selectively enabled (for instance, by a class C bias circuit) at high power levels.

Doherty power amplifiers operate with high efficiency at 6 dB power back-off, but suffer from inefficiencies at lower power levels, for very high peak-to-average ratio (PAPR) waveforms, and/or when the output power is not well-centered at the peak of the amplifier's power-dependent efficiency profile. For example, advanced modulation schemes with high PAPR (for instance, 5G waveforms) require the amplifier to be operated several dB from the maximum saturated output power (Psat) to maintain linearity. Since even a small signal drive can lead a Doherty power amplifier to reach maximum saturated output power of its dynamic range, the backed-off power efficiency of a Doherty power amplifier is more important than its peak efficiency.

Moreover, the linearity of a Doherty power amplifier is particularly susceptible to degradation in the presence of load variation. For example, an amplitude distortion (AM/AM) of the carrier amplifier is a function of the load VSWR, while the AM/AM of the peaking amplifier is a function of input power, which is typically uncorrelated to the load VSWR.

Asymmetric Doherty power amplifiers are provided herein. In certain embodiments, a Doherty power amplifier includes a carrier amplifier and a peaking amplifier that operate in combination with one another to amplify an RF input signal to generate an RF output signal. Additionally, the peaking amplifier is implemented with an amplifier size that is smaller than an amplifier size of the carrier amplifier.

For example, the peaking amplifier can be implemented with a transistor output array for generating a peaking amplifier output signal, while the carrier amplifier can be implemented with a transistor output array for generating a carrier amplifier output signal that is combined with the peaking amplifier output signal to generate the RF output signal. Additionally, an array size N of the peaking amplifier's transistor output array is less than the array size M of the carrier amplifier's transistor output array.

By implementing the Doherty power amplifier in this manner, a sharper amplitude distortion (AM/AM) response is provided with little to no impact on phase distortion (PM/PM). Thus, a number of improvements in power amplifier performance can be achieved, including, but not limited to, enhancement in adjacent channel leakage ratio (ACLR), maximum power reduction (MPR) specifications, and/or linear range.

Figure 2A:
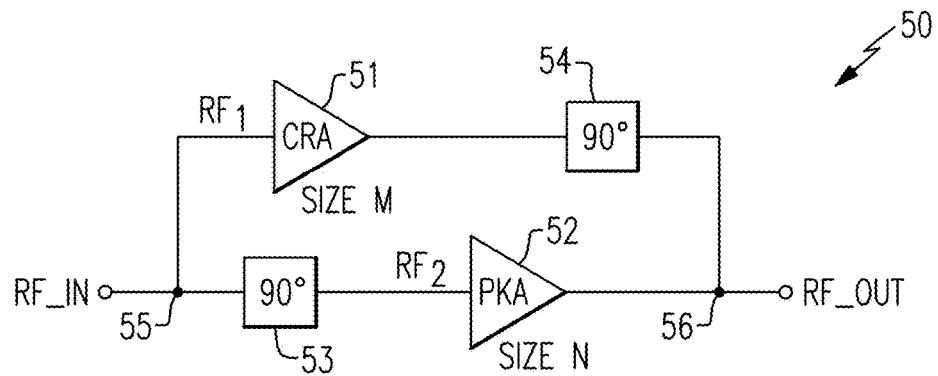
FIG. 2A is a schematic diagram of a Doherty power amplifier according to one embodiment.

FIG. 2A is a schematic diagram of a Doherty power amplifier 50 according to one embodiment. The Doherty power amplifier 50 includes a carrier amplifier 51, a peaking amplifier 52, an input phase shifter 53, and an output phase shifter 54.

Although one embodiment of a Doherty power amplifier is shown, the teachings herein are applicable to Doherty power amplifiers implemented in a wide variety of ways.

As shown in FIG. 2A, the Doherty power amplifier 50 splits an RF signal received at the input terminal RF_IN to generate a first RF input signal $RF_1$ for the carrier amplifier 51 and a replica of the first RF input signal, which is phase-shifted by the phase shifter 53 (by about ninety degrees, in this example) to generate the second RF input signal $RF_2$. Although an example using an explicit input phase shifter is shown, other implementations are possible. In one example, a 3 dB or hybrid coupler can be used to split the RF signal into a pair of signals having a phase difference of about ninety degrees. Such hybrid couplers can additionally or alternatively be used to combine signals to eliminate an RF output phase shifter.

The carrier amplifier 51 amplifies the first RF input signal $RF_1$ to generate a first amplified RF signal, while the peaking amplifier 52 amplifies the second RF input signal $RF_2$ to generate a second amplified RF signal. The first amplified RF signal is phased-shifted by the output phase shifter 54 (by about ninety degrees, in this example), and thereafter combined with the second amplified RF signal at the node 56 to generate an RF output signal for the output terminal RF_OUT. However, other implementations are possible. For instance, a 3 dB or hybrid coupler can be used to combine the first amplified RF signal and the second amplified RF signal.

As shown in FIG. 2A, the carrier amplifier 51 and the peaking amplifier 52 have different array sizes, which results in the carrier amplifier 51 and the peaking amplifier 52 having different drive strengths and output power capabilities.

For example, as shown in FIG. 2A, the carrier amplifier 51 has an array size M that is larger than an array size N of the peaking amplifier 52.

By implementing the Doherty power amplifier 50 in this manner, a sharper AM/AM response is provided with little to no impact on PM/PM. Moreover, the Doherty power amplifier 50 can exhibit improved ACLR and/or improved linearity at backed off power.

Figure 2B:
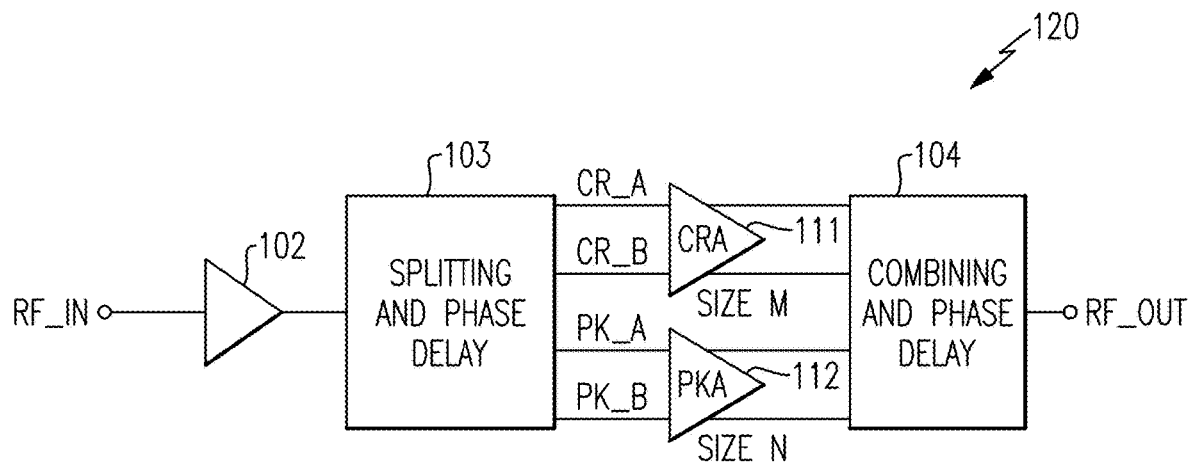
FIG. 2B is a schematic diagram of a Doherty power amplifier according to another embodiment.

FIG. 2B is a schematic diagram of a Doherty power amplifier 120 according to another embodiment. The Doherty power amplifier 120 includes a pre-driver 102, a splitting and phase delay circuit 103, a combining and phase delay circuit 104, a differential carrier amplifier 111, and a differential peaking amplifier 112.

As shown in FIG. 2B, the splitting and phase delay circuit 103 generates various signal components by splitting and delaying an RF input signal from the pre-driver 102. The signal components include a first carrier input signal CR_A, a second carrier input signal CR_B, a first peaking input signal PK_A, and a second peaking input signal PK_B. The first and second carrier input signals CR_A/CR_B are provided as a differential input to the differential carrier amplifier 111 for amplification, while the first and second peaking input signals PK_A/PK_B are provided as a differential input to the differential peaking amplifier 112 for amplification. The combining and phase delay circuit 104 combines the amplified differential signals from the differential carrier amplifier 111 and the differential peaking amplifier 112 with appropriate phase delays to generate an amplified RF output signal RF_OUT.

In the illustrated embodiment, the transistor array size N of the differential peaking amplifier 112 is smaller than the transistor array size M of the differential carrier amplifier 111.

Figure 3:
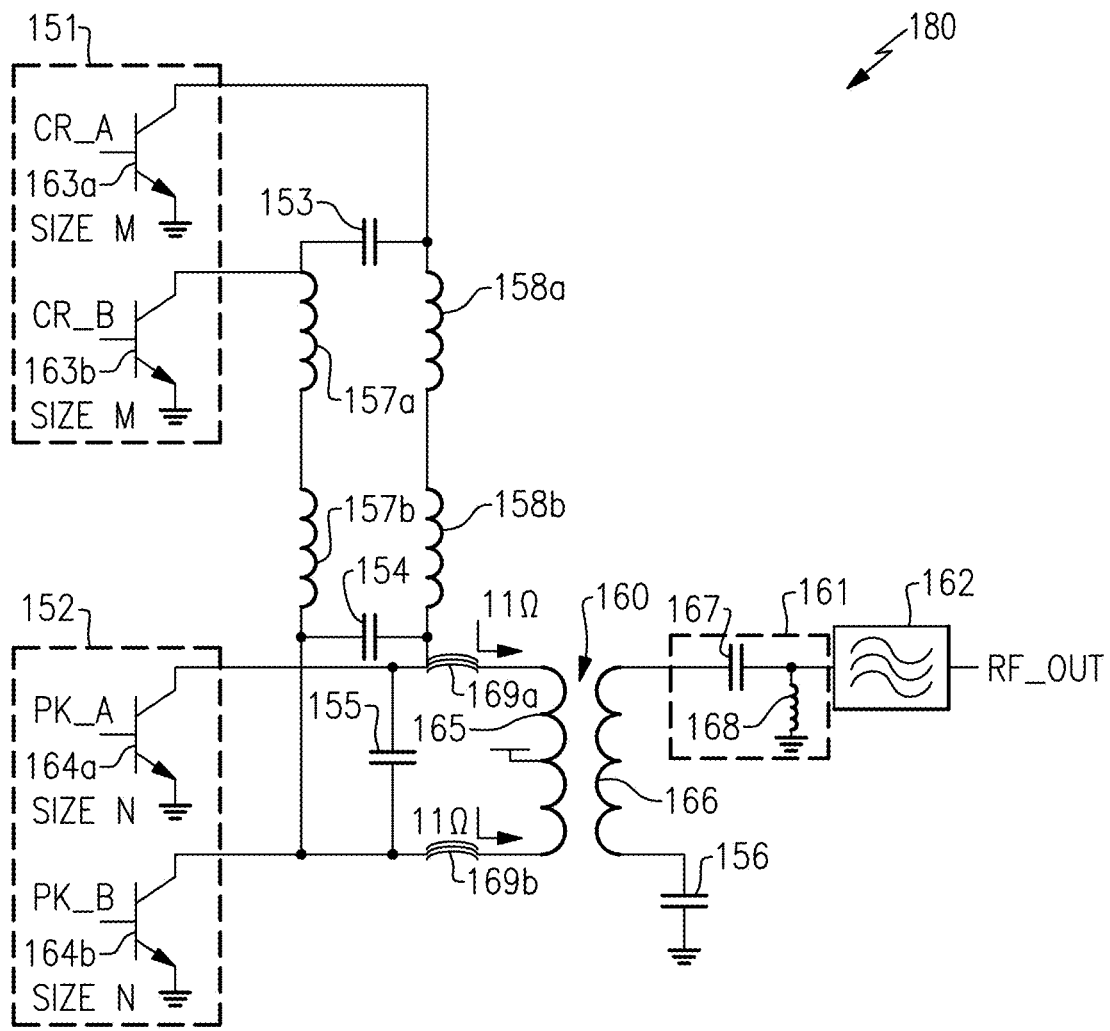
FIG. 3 is a schematic diagram of a portion of a Doherty power amplifier according to another embodiment.

FIG. 3 is a schematic diagram of a portion of a Doherty power amplifier 180 according to another embodiment. In this embodiment, Doherty power amplifier circuitry 180 includes a carrier amplifier transistor output array 151, a peaking amplifier output transistor array 152, a carrier amplifier capacitor 153, a pair of peaking amplifier capacitors 154/155, a load capacitor 156, a first pair of output inductors 157a/157b, a second pair of output inductors 158a/158b, an output balun 160, an output matching network 161, and an output filter 162.

The carrier amplifier transistor output array 151 includes a first carrier transistor 163a that amplifies a first carrier input signal CR_A and a second carrier transistor 163b that amplifies a second carrier input signal CR_B. Additionally, the peaking amplifier transistor output array 152 includes a first peaking transistor 164a that amplifies a first peaking input signal PK_A and a second peaking transistor 164b that amplifies a second peaking input signal PK_B.

As shown in FIG. 3, the peaking amplifier output transistor array 152 has a size N, while the carrier amplifier output transistor array 151 has a size M, where N is less than M.

By implementations a Doherty amplifier with a smaller peaking amplifier array, the array base-to-collector capacitance $C_{BC}$ is smaller than in the situation of a symmetric array. Accordingly, the peaking amplifier array provides a higher transconductance ($g_p$) than the carrier side transconductance ($g_m$).

This higher $g_p$ in turn provides steeper collector current slope and contributes higher power to the combining node, preventing AM/AM from sagging and/or resulting in a flatter AM/AM response in the Doherty operation region.

Moreover, the smaller peaking array can provide a higher $g_p$ in the saturation region. Such performance is not achievable by enhancing the peaking driver/pre-driver bias since such bias affects the small signal transconductance while having little effect in the saturation region.

Furthermore, the aforementioned performance benefits are achieved with little to no impact on AM/PM.

In the illustrated embodiment, the output signals from the carrier amplifier output transistor array 151 and the peaking amplifier output transistor array 152 are combined with appropriate phase shifts using various inductor and capacitor components as depicted. Additionally, a differential RF output signal is provided using wirebonds 169a/169b to a primary winding 165 of the balun 160. A center tap of the primary winding 165 receives a supply voltage, while the secondary winding 166 of the balun 160 is connected between an output matching network 161 and a load capacitor 156. The output matching network 161 includes a series capacitor 167 and a shunt inductor 168, in this embodiment.

The output balun 160 serves to convert the differential RF output signal to a single-ended RF output signal RF_OUT at an output terminal. As shown in FIG. 3, the output matching network 161 and the output filter 162 are connected in cascade between the secondary winding 166 and the output terminal.

Figure 4A:
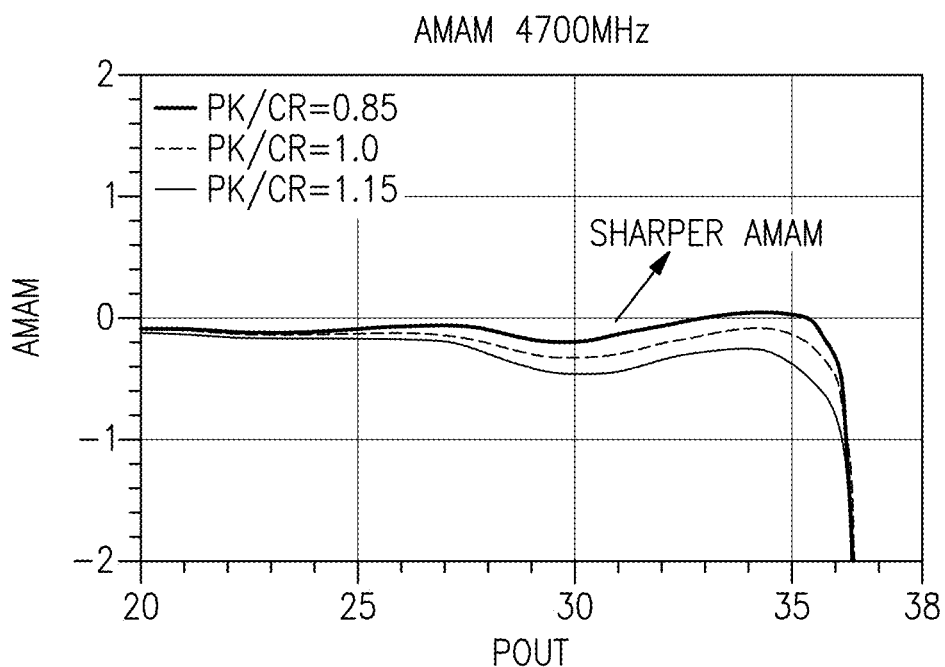
FIG. 4A is one example of a graph of amplitude distortion versus output power.
Figure 4B:
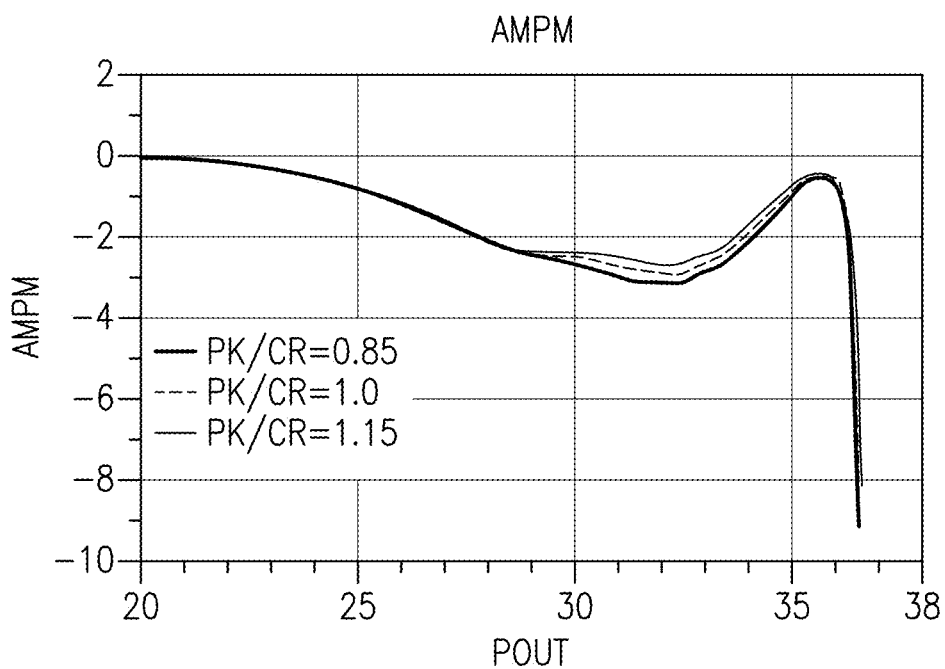
FIG. 4B is one example of a graph of phase distortion versus output power.

FIG. 4A is one example of a graph of amplitude distortion versus output power. FIG. 4B is one example of a graph of phase distortion versus output power.

With reference to FIGS. 4A and 4B, the graphs includes plots of distortion versus output power for different ratios between the array sizes of the peaking amplifier versus the carrier amplifier (PK/CR). Comparing to the baseline (PK/CR=1 corresponding to equal output transistor array sizes), the smaller peaking array (PK/CR=0.85) shows sharper AM/AM in the large signal region which the AM/PM performance is maintained. While on the other hand, larger peaking array (PK/CR=1.15) shows softer AM/AM than the baseline.

Figure 4C:
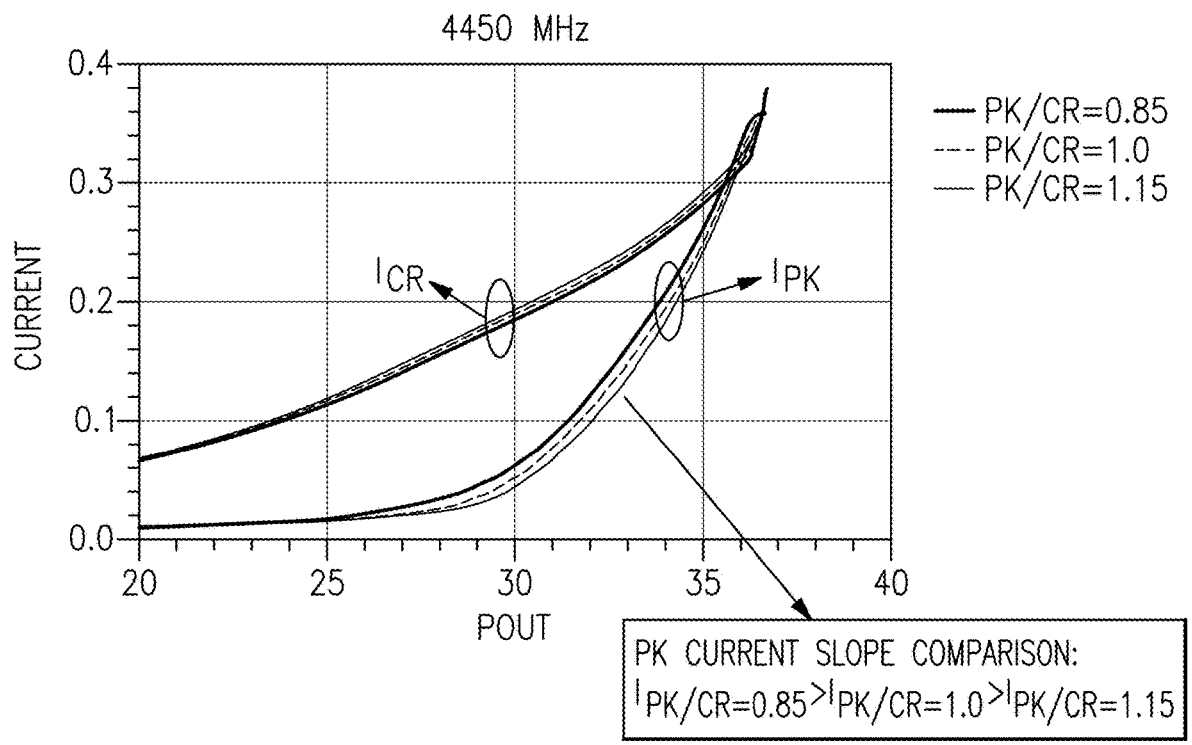
FIG. 4C is one example of a graph of current versus output power.

FIG. 4C is one example of a graph of current versus output power. The graph includes plots of peaking amplifier current and carrier amplifier current for different ratios between the array sizes of the peaking amplifier versus the carrier amplifier (PK/CR).

As shown in FIG. 4C, smaller peaking array translates to a higher transconductance $g_p$ (steeper current slope) that prevents the AM/AM from sagging in Doherty behavior. Such behavior cannot be achieved by bias change on the peaking stage since it does not change the large signal $g_p$.

Figure 4D:
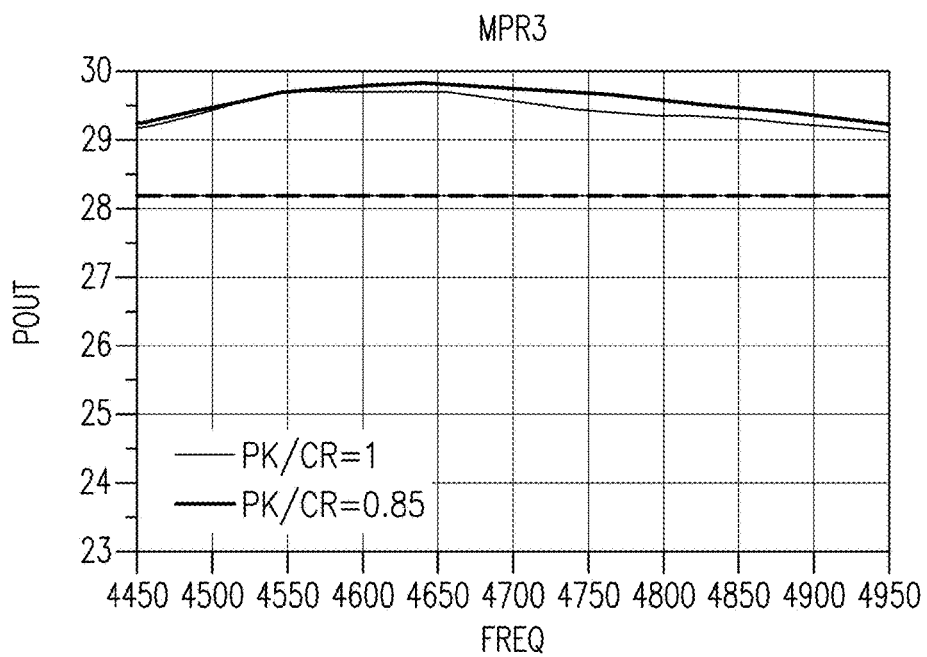
FIG. 4D is one example of a graph of output power versus frequency.
Figure 4E:
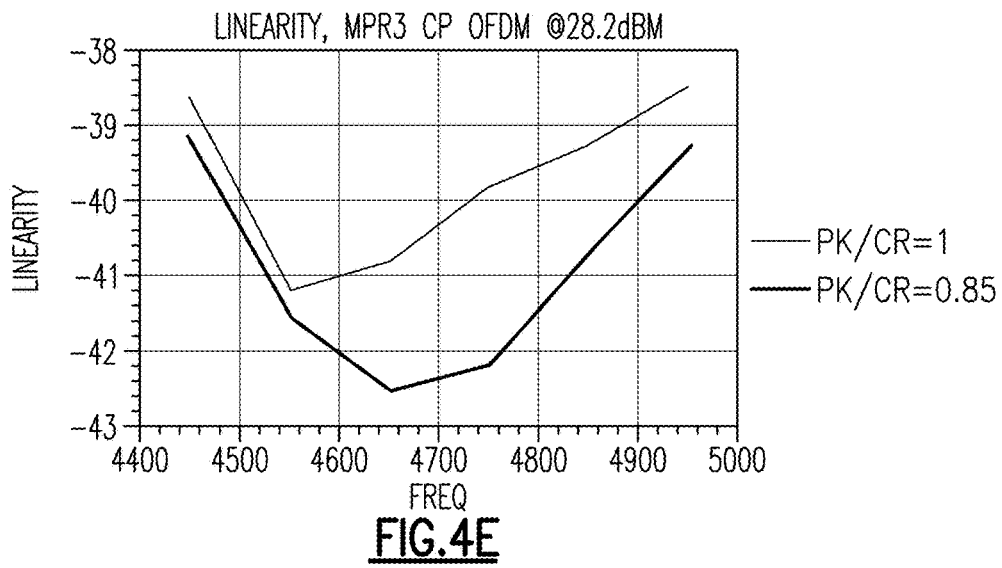
FIG. 4E is one example of a graph of linearity versus frequency.
Figure 4F:
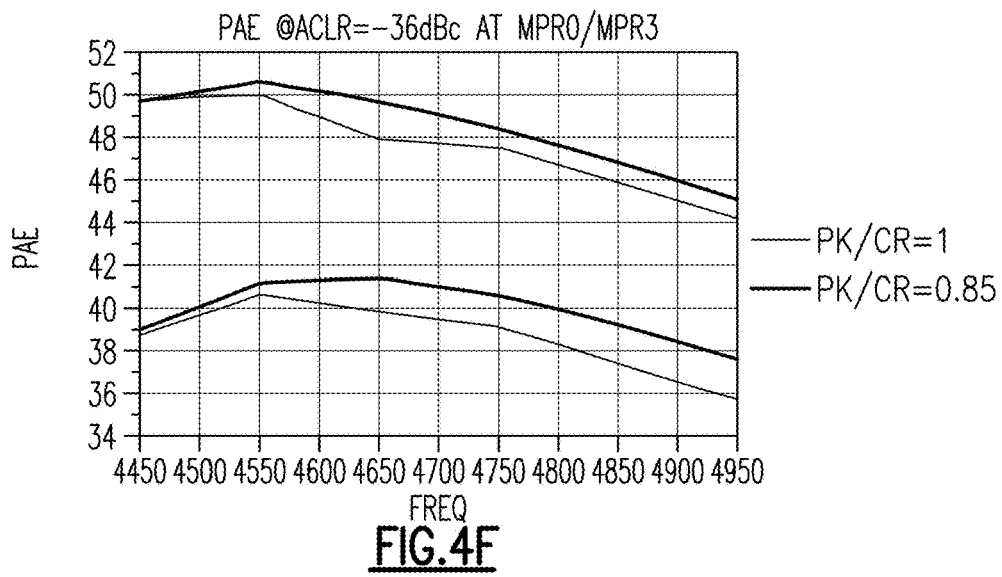
FIG. 4F is one example of a graph of power added efficiency (PAE) versus frequency.
Figure 4G:
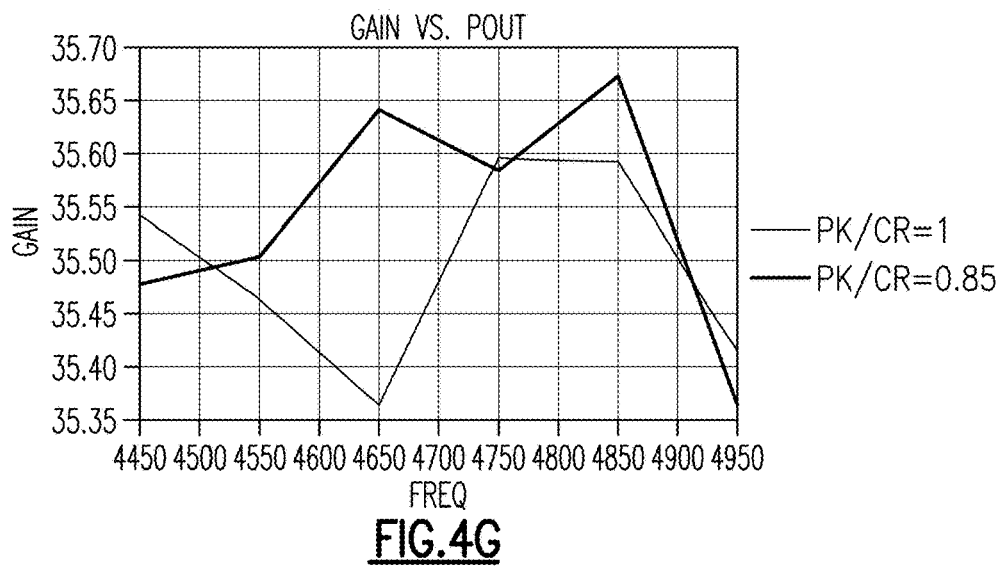
FIG. 4G is one example of a graph of gain versus output power.

FIG. 4D is one example of a graph of output power versus frequency. FIG. 4E is one example of a graph of linearity versus frequency. FIG. 4F is one example of a graph of power added efficiency (PAE) versus frequency. FIG. 4G is one example of a graph of gain versus output power.

The graphs include plots for equal array sizes (CR/PK=1) as well as with the peaking amplifier array size being smaller (CR/PK=0.85).

As shown in FIGS. 4D to 4G, the asymmetrical Doherty provides better MPR3 linearity at the same power level and higher PABO linear PAE and power. The gain is similar to baseline.

Figure 5:
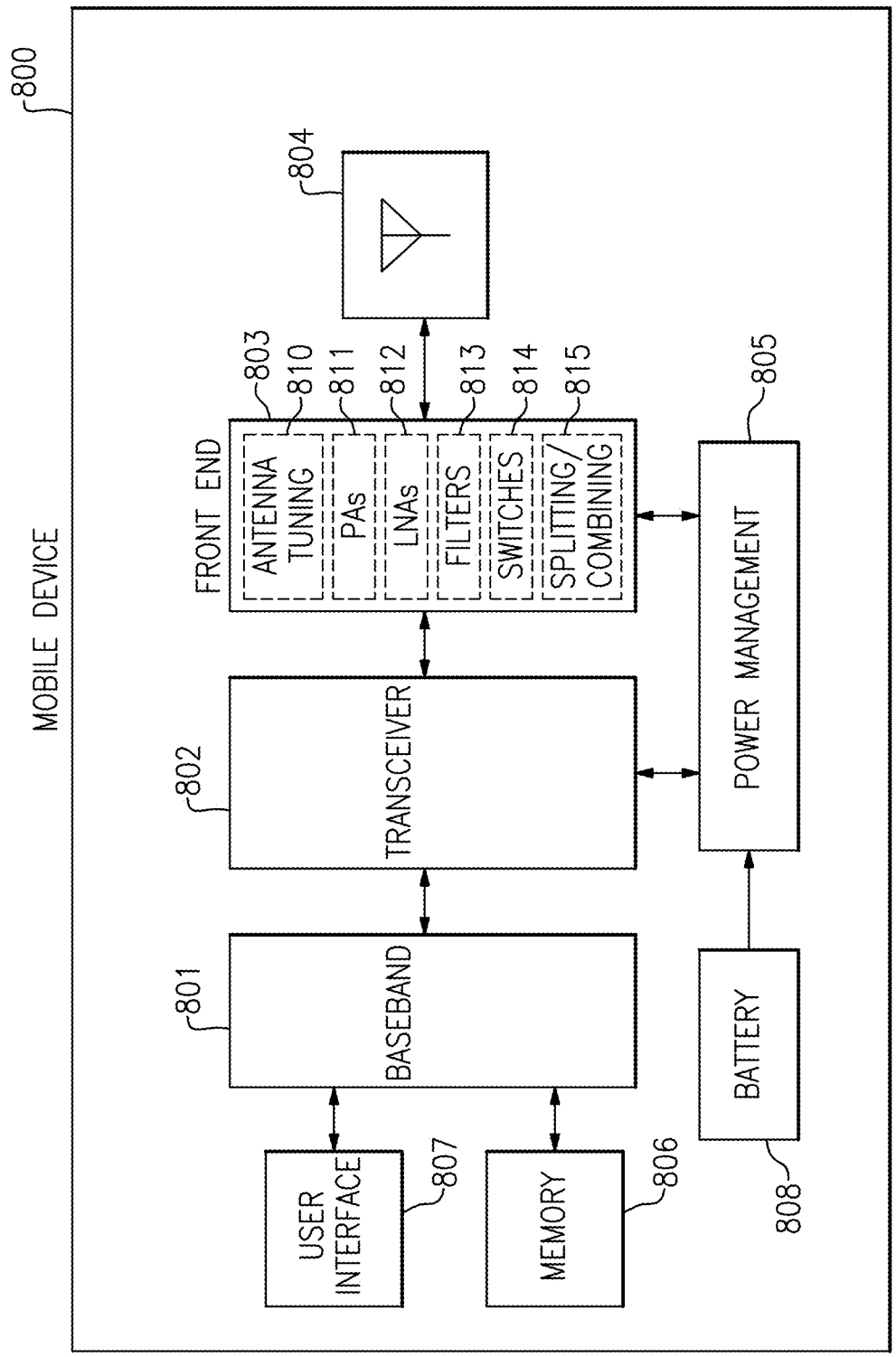
FIG. 5 is a schematic diagram of one embodiment of a mobile device.

FIG. 5 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 5 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible. The front end system 803 (for example, the PAs 811) can include one or more coupled line Doherty power amplifiers implemented in accordance with the teachings herein.

Thus, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is connected to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 5, the baseband system 801 is connected to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 5, the power management system 805 receives a battery voltage from the battery 808. The battery 808 can be any suitable battery for use in the mobile device 800, including, for example, a lithium-ion battery.

Figure 6:
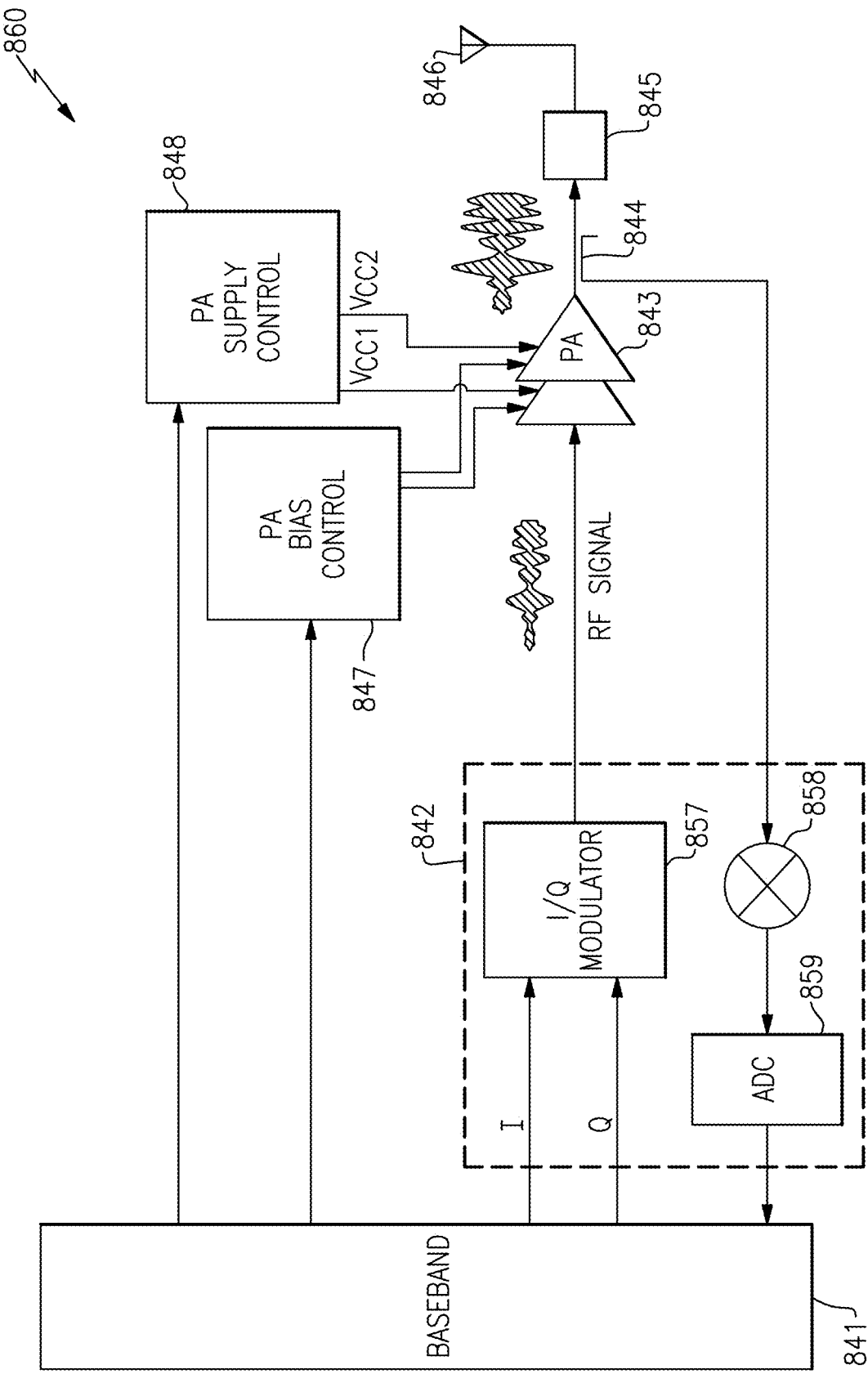
FIG. 6 is a schematic diagram of a power amplifier system according to one embodiment.

FIG. 6 is a schematic diagram of a power amplifier system 860 according to one embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845. The power amplifier 843 can be implemented with one or more features of the present disclosure.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 6, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Figure 7A:
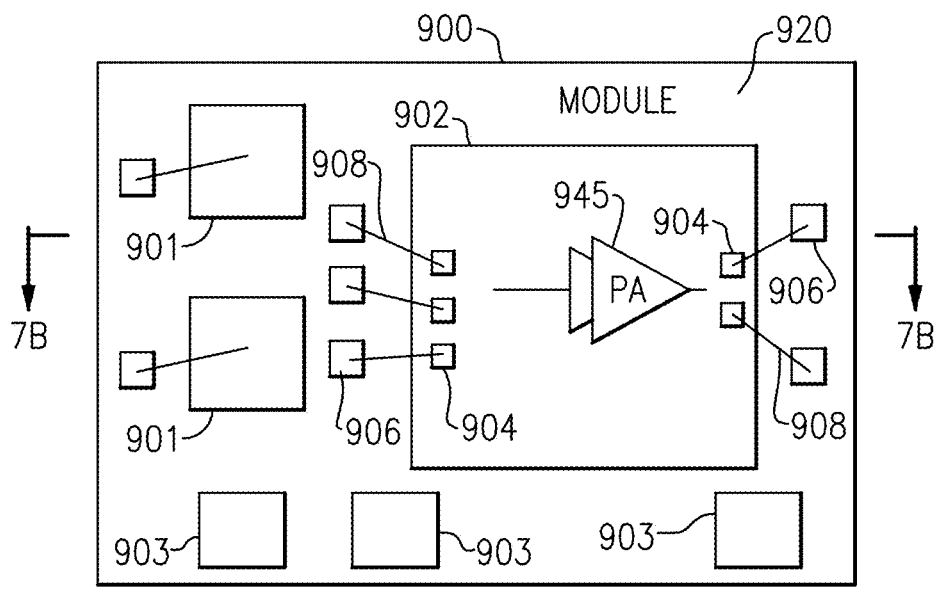
FIG. 7A is a schematic diagram of one embodiment of a packaged module.
Figure 7B:
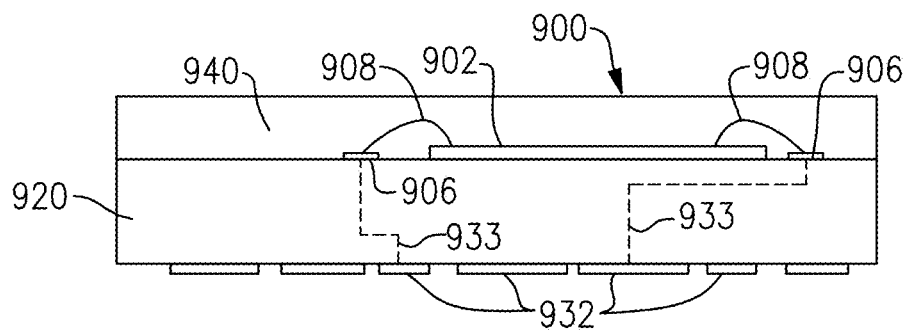
FIG. 7B is a schematic diagram of a cross-section of the packaged module of FIG. 7A taken along the lines 7B-7B.

FIG. 7A is a schematic diagram of one embodiment of a packaged module 900. FIG. 7B is a schematic diagram of a cross-section of the packaged module 900 of FIG. 7A taken along the lines 7B-7B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a power amplifier 945, which can be implemented in accordance with one or more features disclosed herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 7B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 7B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Applications

The principles and advantages of the embodiments herein can be used for any other systems or apparatus that have needs for RF amplification. Examples of such apparatus include RF communication systems. RF communications systems include, but are not limited to, mobile phones, tablets, base stations, network access points, customer-premises equipment (CPE), laptops, and wearable electronics. Thus, the RF combiners herein can be included in various electronic devices, including, but not limited to, consumer electronic products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a transceiver configured to generate a radio frequency input signal; and
a front end system including a Doherty power amplifier including a carrier amplifier configured to generate a radio frequency carrier signal based on amplifying the radio frequency input signal, a peaking amplifier configured to generate a radio frequency peaking signal based on amplifying the radio frequency input signal, and a phase shifting and combining circuit configured to combine the radio frequency carrier signal and the radio frequency peaking signal to generate a radio frequency output signal, the carrier amplifier and the peaking amplifier having asymmetric amplifier sizes, the peaking amplifier having an output transistor array size that is smaller than an output transistor array size of the carrier amplifier.

2. The mobile device of claim 1 wherein the output transistor array size of the peaking amplifier is at least ten percent smaller than the output transistor array size of the carrier amplifier.

3. The mobile device of claim 1 wherein the carrier amplifier includes a first differential output configured to provide the radio frequency carrier signal, and the peaking amplifier includes a second differential output configured to provide the radio frequency peaking signal.

4. The mobile device of claim 3 wherein the phase shifting and combining circuit includes an output balun having a primary winding connected to the second differential output, and a plurality of passive components connected between the first differential output and the primary winding and operable to provide a phase shift to the radio frequency carrier signal.

5. The mobile device of claim 4 further comprising an output matching circuit and an output filter connected in series between a secondary winding of the output balun and an output terminal that provides the radio frequency output signal.

6. The mobile device of claim 3 wherein the carrier amplifier includes a first pair of bipolar transistors and the peaking amplifier includes a second pair of bipolar transistors of smaller size than the first pair of bipolar transistors, the first differential output being across a first pair of collectors of the first pair of bipolar transistors, and the second differential output being across a second pair of collectors of the second pair of bipolar transistors.

7. The mobile device of claim 1 further comprising a splitting and phase shifting circuit configured to receive the radio frequency input signal and to provide a first radio frequency signal to an input of the carrier amplifier and a second radio frequency signal to an input of the peaking amplifier, the first radio frequency signal and the second radio frequency signal having a phase shift of about ninety degrees.

8. The mobile device of claim 1 further comprising an antenna configured to transmit the radio frequency output signal.

9. A Doherty power amplifier comprising:
- a carrier amplifier configured to generate a radio frequency carrier signal based on amplifying a radio frequency input signal;
- a peaking amplifier configured to generate a radio frequency peaking signal based on amplifying the radio frequency input signal; and
- a phase shifting and combining circuit configured to combine the radio frequency carrier signal and the radio frequency peaking signal to generate a radio frequency output signal, the carrier amplifier and the peaking amplifier having asymmetric amplifier sizes, the peaking amplifier having an output transistor array size that is smaller than an output transistor array size of the carrier amplifier.

10. The Doherty power amplifier of claim 9 wherein the output transistor array size of the peaking amplifier is at least ten percent smaller than the output transistor array size of the carrier amplifier.

11. The Doherty power amplifier of claim 9 wherein the carrier amplifier includes a first differential output configured to provide the radio frequency carrier signal, and the peaking amplifier includes a second differential output configured to provide the radio frequency peaking signal.

12. The Doherty power amplifier of claim 11 wherein the phase shifting and combining circuit includes an output balun having a primary winding connected to the second differential output, and a plurality of passive components connected between the first differential output and the primary winding and operable to provide a phase shift to the radio frequency carrier signal.

13. The Doherty power amplifier of claim 12 further comprising an output matching circuit and an output filter connected in series between a secondary winding of the output balun and an output terminal that provides the radio frequency output signal.

14. The Doherty power amplifier of claim 11 wherein the carrier amplifier includes a first pair of bipolar transistors and the peaking amplifier includes a second pair of bipolar transistors of smaller size than the first pair of bipolar transistors, the first differential output being across a first pair of collectors of the first pair of bipolar transistors, and the second differential output being across a second pair of collectors of the second pair of bipolar transistors.

15. The Doherty power amplifier of claim 9 further comprising a splitting and phase shifting circuit configured to receive the radio frequency input signal and to provide a first radio frequency signal to an input of the carrier amplifier and a second radio frequency signal to an input of the peaking amplifier, the first radio frequency signal and the second radio frequency signal having a phase shift of about ninety degrees.

16. A method of radio frequency signal amplification in a mobile device, the method comprising:
- generating a radio frequency carrier signal based on amplifying the radio frequency input signal using a carrier amplifier;
- generating a radio frequency peaking signal based on amplifying the radio frequency input signal using a peaking amplifier; and
- combining the radio frequency carrier signal and the radio frequency peaking signal to generate a radio frequency output signal using a phase shifting and combining circuit, the carrier amplifier and the peaking amplifier having asymmetric amplifier sizes, the peaking amplifier having an output transistor array size that is smaller than an output transistor array size of the carrier amplifier.

17. The method of claim 16 wherein the output transistor array size of the peaking amplifier is at least ten percent smaller than the output transistor array size of the carrier amplifier.

* * * * *